March 8, 1966 J. H. ANDREATTA 3,239,771

HIGH POWER SWITCHING AMPLIFIER WHEREIN ENERGY IS TRANSFERRED TO A TUNED CIRCUIT DURING BOTH HALF CYCLES

Filed Feb. 6, 1963

WITNESSES:

Bernard R. Gieguez

William L. Gates

INVENTOR

James H. Andreatta

BY Ernest P. Klipfel

ATTORNEY

United States Patent Office 3,239,771
Patented Mar. 8, 1966

3,239,771
HIGH POWER SWITCHING AMPLIFIER WHEREIN ENERGY IS TRANSFERRED TO A TUNED CIRCUIT DURING BOTH HALF CYCLES

James H. Andreatta, Glen Burnie, Md., assignor to Westinghouse Electric Corporation, Pittsburgh, Pa., a corporation of Pennsylvania Filed Feb. 6, 1963, Ser. No. 256,693
5 Claims. (Cl. 330—18)

This invention relates to semiconductor amplifier circuitry and more particularly to an improved solid state radio frequency (RF) amplifier which utilizes transistors operated in a switching mode of operation in combination with a network having a low impedance to fundamental frequencies and a high impedance to harmonics to provide a relatively high overall operating efficiency.

The subject invention is an improvement on solid state radio frequency amplifiers of the type described and claimed in Serial No. 256,701, filed February 6, 1963, and assigned to the assignee of the present application. In such a solid state radio frequency amplifier, at least one pair of transistors operating in a switching mode at the frequency to be amplified is utilized to alternately charge and discharge a network providing a low impedance to said frequency but a relatively high impedance to all harmonics. The transistors are connected in series across a supply voltage and operate such that during one half of a cycle a first transistor conducts while the second remains non-conducting. However, during the other half cycle the operation reverses such that the second transistor becomes conducting while the first transistor becomes non-conducting. In this manner during one half of a cycle the network is charged substantially to the supply voltage through one of the pair and then during the other half cycle the network discharges to ground through the other of said pair. In addition, the transistors are driven into the saturation region with just enough base current to maintain saturation over the conduction period without over-driving it at any time. By utilizing transistors operated in the saturation region during conduction and maintaining the saturation resistance at the lowest possible value, which is accomplished with the driving signal mentioned, and by charging and discharging the network, an overall operating efficiency heretofore unobtainable is provided.

It is the object of the present invention to provide an improved high efficiency solid state RF amplifier.

It is another object of the present invention to provide an improved, high efficiency transistor radio frequency amplifier circuit.

It is still a further object of the present invention to provide an improved high efficiency transistor RF amplifier circuit providing improved power output characteristics.

Briefly, the present invention accomplishes the above-cited objects by providing an RF amplifier comprising a network which provides a low impedance to the frequency to be amplified but a high impedance to all harmonics and at least two pairs of transistors connected to the network such that one pair is connected to one side while the second pair is connected to the other side to switch both sides of the network alternately to a voltage source for charging and discharging. On one half cycle of operation one side of the network is switched to the supply voltage source in one direction while the opposite side is switched to ground. On the second half cycle the said one side of the network is connected to ground while the opposite side is switched to the supply voltage so that energy is applied to the network in the reverse direction. The network is thus charged to a predetermined voltage in one direction and then discharges and recharges to substantially the same voltage in the opposite direction. The pairs of transistors are operated in a switching mode of operation to provide the required connection and the network is force charged on both half cycles of operation such that energy is transferred to the network from the supply voltage on both half cycles instead of every other half cycle as provided for in the prior art. Additionally, the transistor pairs are driven in a manner to operate between the conducting and non-conducting states but being driven into the saturation region of the current voltage characteristic of the transistor such that the minimum possible internal resistive impedance is maintained when conducting.

Other objects and advantages will become apparent as the following description proceeds. For a better understanding of the invention, reference may be had to the accompanying drawing, in which.

Figure 1:
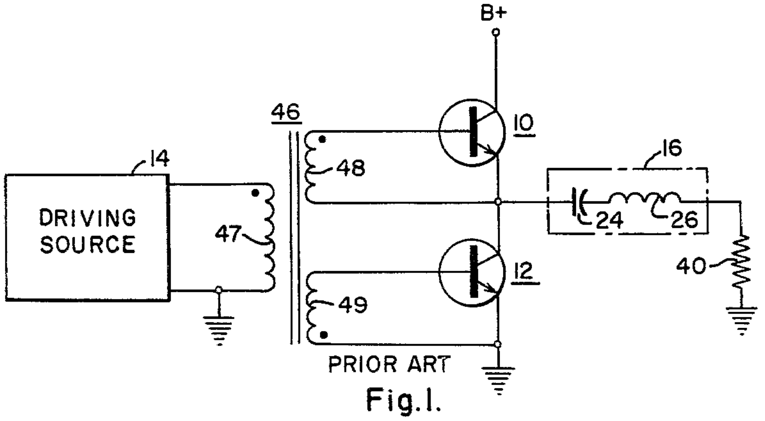
FIGURE 1 is a schematic diagram of the prior art.

The prior art circuit illustrated in FIG. 1 utilizes a pair of transistors 10 and 12 to alternately charge and discharge a network 16 comprising a capacitor 24 and an inductance 26 connected in series. During one half cycle of operation, transistor 10 is made conductive by means of a driving signal from the driving source 14 in which case the network is connected to the B+ supply voltage source, not shown, and charges substantially to the supply voltage through a charging path provided by transistor 10 and a load impedance 40 connected to ground. During this first half cycle, transistor 12 is rendered non-conductive and substantially acts like an open circuit. During the other half cycle of operation transistor 10 is rendered non-conductive and transistor 12 is made conductive by means of the driving signal from the driving source 14 to provide a discharge path for the network 16, the discharge path being through transistor 12 to ground and back through the load impedance 40. The network 16 has a predetermined resonant frequency and the driving source provides a substantially sinusoidal input signal to the transistors 10 and 12 to switch the transistors alternately between the conducting and non-conducting states at a frequency substantially equal to the resonant frequency of the network so that the network is charged and discharged at a frequency equal to the resonant frequency.

Figure 2:
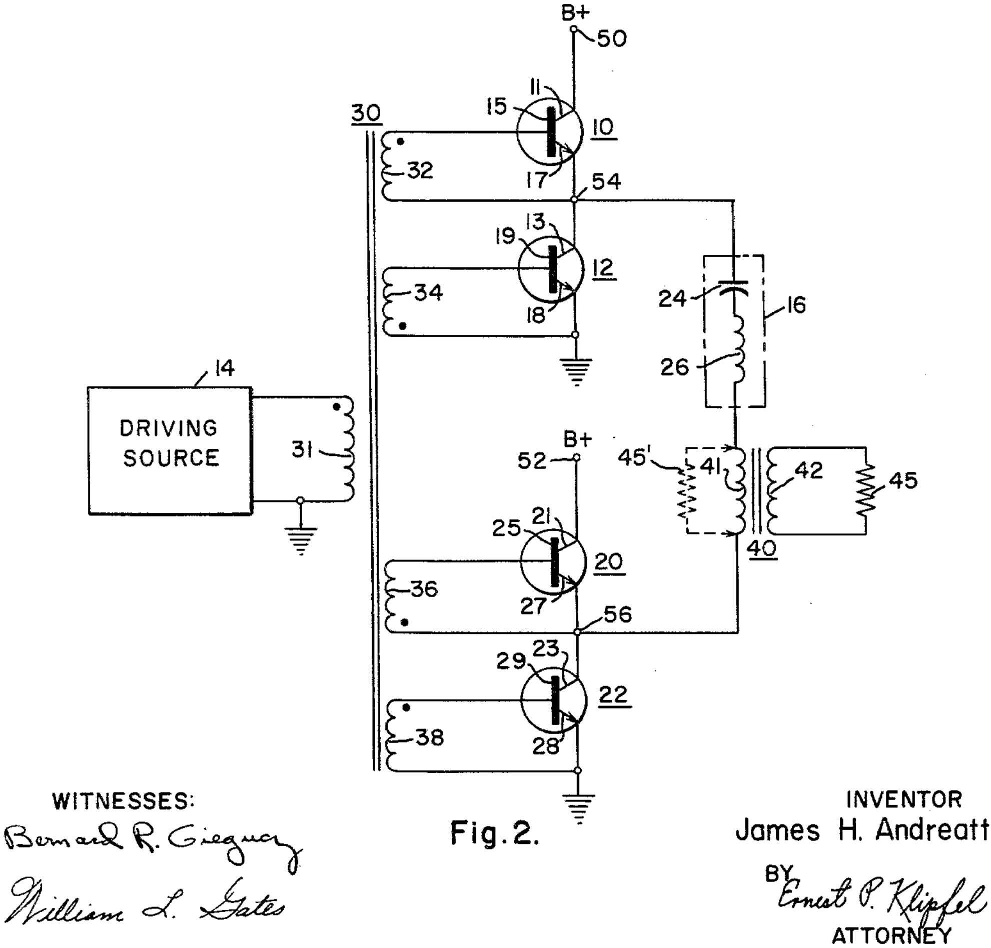
FIG. 2 is a schematic diagram illustrative of an embodiment of the present invention.

Directing attention now to FIG. 2, there is disclosed a first pair of N-P-N transistors 10 and 12 and a second pair of N-P-N transistors 20 and 22 coupled across a network 16, comprising the combination of a capacitor 24 and an inductance 17, connected in series with a load impedance 40. The transistors 10 and 12 are connected in series across a B+ supply voltage source, not shown, having one of its output terminals connected to a point of common reference potential illustrated here as ground. The connections are such that the emitter 17 of transistor 10 is connected to the collector 13 of transistor 12. The collector 11 of transistor 10 is connected to a terminal 50 which is adaptable to be connected to the B+ supply voltage not shown. The emitter 18 of transistor 12 is returned to ground.

The second pair of transistors 20 and 22 are similarly connected in that they are connected in series across the B+ supply voltage in the same manner as the first pair of transistors 10 and 12. More particularly, the emitter 27 of transistor 20 is connected to the collector 23 of transistor 22 and the collector 21 of transistor 20 is connected to terminal 52 which is adapted to be connected to the B+ supply voltage source and the emitter 28 of transistor 22 is returned to ground.

The network 16, comprising capacitor 24 and inductance 26 has one end connected to the common connection between transistors 10 and 12 at junction 54. The other end of the network 16 is connected in series circuit relationship to the primary winding 41 of an output or impedance matching transformer 40. The other end of the primary winding 41 is connected to the common connection between transistors 20 and 22 at junction 56. A load impedance 45 is connected across the secondary winding 42 of transformer 40 and this impedance is reflected back to the primary winding 41 as an impedance 45' connected in series between junction 56 and the network 16. The value of the reflected load impedance 45' is dependent upon the magnitude or the value of the load impedance 45 and the turns ratio of the transformer 40. The load impedance 45, moreover, might represent the radiation resistance of an antenna system.

A driving source 14 is coupled to transistors 10, 12, 20 and 22 for rendering the transistors selectively conducting and non-conducting. The coupling means employed comprises a transformer 30 having the primary winding 31 connected to the driving source 14. Current input signals are applied to the respective base from the driving source 14 by means of the secondary windings 32, 34, 36 and 38.

The windings 32, 34, 36 and 38 are wound in a predetermined manner with respect to the primary winding 31 so that the voltage appearing across these windings will have predetermined relative polarities. The terminals of like instantaneous polarity are indicated by the dots located at one end of the respective windings. As such, the secondary windings 32 and 34 provide mutually opposite polarity signals to the bases 15 and 19 respectively. Likewise windings 36 and 38 provide mutually opposite polarity signals to the bases 25 and 29 respectively.

The secondary winding 32 is connected to transistor 10 such that the terminal indicated by the dot is connected to the base 15 whereas the opposite terminal is connected to junction 54. Secondary winding 34 is connected to transistor 12 in a manner such that the terminal having the dot is connected to ground while the opposite end is connected to the base 19.

Similarly, secondary windings 36 and 38 are connected to transistors 20 and 22 respectively. However, it should be noted that the polarity of the windings 32 and 34 are connected in reverse fashion with respect to the relative polarities of secondary windings 36 and 38. By this is meant that secondary winding 36 has the terminal indicated by the dot connected to the junction 56 whereas the opposite end is connected to the base 25, and finally secondary winding 38 has the terminal indicated by the dot connected to the base 29 whereas the opposite end is connected to ground.

In operation, the driving source 14 provides input base currents to the respective bases rendering transistors 10 and 22 simultaneously conductive during the first half cycle of operation while transistors 12 and 20 are driven non-conductive. During the second half cycle of operation however transistors 12 and 20 are rendered conductive while transistors 10 and 22 are driven non-conductive. Thus, during the first half cycle of operation the B+ supply voltage connected to terminal 50 is applied across one end of the network 16 at junction 54 while the other end of the network is returned to ground through the primary winding 41 and the conductive transistor 22. During the second half cycle the B+ supply voltage applied to terminal 52 is applied through transistor 20 such that the B+ supply voltage is applied to the end of the network 16 connected to the primary winding 41 while the end tied to junction 54 is returned to ground through the now conducting transistor 12. In this manner the network 16 charges in one direction substantially to the B+ supply voltage during one half cycle of operation and then during the second half cycle of operation the B+ supply voltage is applied in a reverse direction such that the prior acquired charge discharges and the network 16 charges substantially to the B+ potential in a reverse direction.

The network 16 provides a low impedance to a predetermined fundamental frequency but a high impedance to all harmonics of the fundamental frequency. The network 16 is shown, by way of example, as a series circuit combination of inductance 26 and capacitor 24. Such a combination will exhibit a series resonant condition at a predetermined resonant frequency providing the impedance characteristics previously mentioned. Although the components have been indicated to have fixed values, it is to be understood that both or either may be made variable depending upon the desires of the user. By selectively choosing the resonant frequency of the network 16 to be substantially equal to the frequency of the driving source 14 the transistor pairs are selectively switched between conductive and non-conductive states at a rate substantially equal to the fundamental or the resonant frequency of the network 16.

By driving the transistors in a manner described in the aforementioned co-pending application the transistors when conductive provide a minimum possible resistive internal impedance over the respective conductive periods and as such the conductive transistors could be replaced by a switch contact with a resistance path equal to the saturation resistance exhibited. Therefore, the series resonant circuit comprised of capacitor 24 and inductance 26 is charged through the minimal internal resistance of transistors 10 and 22 during the first half cycle of operation and then during the second half cycle discharges and recharges in a reverse direction through the minimal internal resistance or saturation resistance of transistors 12 and 20.

Energy is thus transferred to the network 16 on both half cycles of operation instead of every other half cycle as provided for in the prior art. Whereas in the prior art circuit as indicated in FIG. 1, the voltage appearing across the network 16 varies between the B+ supply voltage and ground, in the applicant's invention the voltage appearing across the network 16 now varies between the B+ supply voltage in one polarity direction during a first half cycle and substantially the same B+ supply voltage in a reverse polarity direction during the second half cycle. The average voltage appearing across the network in the prior art circuit is equal to B+/2, however in the instant invention an average voltage equal to B+ is applied across the network 16. Assuming that like transistors are used in both circuits and that they are operated at maximum rated current and maximum rated voltage, the circuit of the present invention applies twice the voltage across the network and load as the circuit in FIG. 1 without exceeding the voltage rating of the transistors. To maintain the same value of maximum peak current, with the doubled voltage, it is necessary to double the impedance level of that utilized by the prior art. The power delivered to the load 45 under these conditions is twice that of the prior art circuit.

On the other hand, by paralleling two transistors for each transistor 10, 12, 20 and 22 of FIGURE 2 to increase the current capability, four times the power will be produced at the same impedance level used for the circuit of FIGURE 1. While it may appear that similar results could have been obtained with the circuit in FIGURE 1 by reducing the effective load resistance 40 by the use of a suitable matching transformer and by paralleling more transistors to conduct the increased current, there are practical limits to the extent which this process can be used and still maintain the high efficiency characteristic of the circuit. The circuit losses due to such things as transistor saturation resistance, copper losses, etc., must be kept very small with respect to the reflected load impedance 45' or high efficiency operation cannot be maintained. State-of-the-art techniques, physical size and economics limit the extent to which these circuit losses can be reduced for a given circuit configuration. Therefore, there is a limit as to the extent which the effective load resistance 45 can be lowered by a matching transformer. This limit becomes particularly acute in high power applications because the relatively low voltage ratings of semiconductor devices requires the use of very large currents to produce the required power. Since the current which flows in the circuit is determined by the reflected load impedance it, of necessity, has to be very small. For example, with 100 volt transistors, the reflected impedance in FIGURE 1 for a 5 kilowatt circuit module would be approximately 0.25 ohm.

If a transistor of a given current and voltage rating is used in the circuit of FIGURE 1 and if these transistors are paralleled to increase their current capability and if load impedance is made as small as possible while still maintaining a required efficiency, a certain power will be delivered to the load 40. This represents the maximum possible power capability of the circuit for a given efficiency and with a semi-conductor having given current and voltage capabilities. The voltage at the load 40 cannot be increased because the semiconductor will be overstressed. The current in the load cannot be increased because the reflected load impedance has been made as small as is economically feasible without sacrificing efficiency.

If, however, transistors having the same current and voltage characteristics as those above are connected in the present invention and if the same value of reflected load impedance is maintained, it will be possible to deliver four times the power into the load because the effective voltage across the load will have been doubled due to the fact that energy is delivered to the circuit on both half cycles of the radio frequency wave. Paralleled transistors will be necessary to handle increased power but the number of transistors used per unit of power is the same in both circuits.

Where the highest possible efficiency is the paramount consideration, the circuit 2 comprising the applicant's invention makes it possible to deliver the same power into a load impedance four times that of FIGURE 1. Assuming fixed circuit losses, the increased load impedance will affect a higher efficiency because a larger percentage of the power being switched will be delivered to the load 15.

To summarize, the present invention provides a means to increase the power delivery capability of a given device having fixed current and voltage limitations by a factor of four to one without exceeding the current and voltage ratings of the device. Where the highest possible efficiency is required, applicant's apparatus provides the means of increasing the impedance level for a given power to obtain a four to one advantage over the fixed circuit losses additionally. The devices are connected so that the failure of one unit will not cause progressive failures of the remaining units.

What has been described therefore, is an improved semiconductor RF amplifier providing an increased power output capability while maintaining the circuit operating parameters identical to that of the prior art circuitry.

Although the present invention has been described with respect to a preferred embodiment which gives satisfactory results, it should be understood that the present disclosure has been made only by way of example and that numerous changes in the detail of circuitry by way of the combination or arrangement of elements may be resorted to without departing from the scope and spirit of the present invention. For example, P–N–P type transistors may be employed when accompanied by a corresponding rearrangement of voltages polarities. Also, the resonant network illustrated as a simple series circuit may be replaced by a suitable frequency selective circuit, such as a low pass or a band pass filter, when desired. Any network providing the disclosed frequency response is meant to be included in the teachings of this invention. Further appropriate series and parallel arrangements of like elements may be employed to provide greater power handling capabilities.

What I claim is:

1. In combination, a tuned frequency selective network providing a relatively low impedance to current flow at predetermined frequencies while providing a high impedance to harmonic current flow ;a plurality of semiconductor means connected at opposite ends of said network for alternately charging said network to a voltage in one current direction during a first period of operation and then substantially discharging said voltage and charging to another voltage in an opposite current direction during a second period of operation; driver means supplying an input current to both of said plurality of semiconductor means rendering each of said semiconductor means selectively conductive during said first and said second period of operation at a rate substantially equal to said predetermined frequencies in a manner to provide the minimum possible internal resistive impedance to current flow during said first and said second period of operation; and load means coupled to said network for providing an output signal in accordance with the charging and discharging of said tuned frequency selective network.

2. A semiconductor radio frequency amplifier comprising in combination, a series resonant network including a load providing a relatively low impedance to current flow at a predetermined resonant frequency; a first semiconductor means coupled to one end of said network; a second semiconductor means coupled to the other end of said network, said first and said second semiconductor means connected to a source of predetermined voltage and operative in a switching mode to charge and discharge said network alternately to said predetermined voltage in a first sense during one half cycle of operation and then substantially discharging said network and charging said network to substantially said predetermined voltage in an opposite sense during the other half cycle of operation; and driver means for supplying an input signal to said first and said second semiconductor means for rendering said first and said second semiconductor means selectively conductive and non-conductive during each half cycle of operation in a manner to provide a minimum saturation impedance during conduction of said semiconductor means to reduce the inherent power dissipation.

3. A semiconductor amplifier comprising in combination, a selectively tuned network including output means providing a low impedance to a predetermined resonant frequency but providing a high impedance to harmonics thereof; a first transistor connecting one end of said network to a voltage source of predetermined magnitude; a second transistor connecting said one end of said network to a point of reference potential; a third transistor connecting the opposite end of said network to said predetermined voltage; a fourth transistor connecting said opposite end of said resonant circuit to said reference potential; means for selectively rendering said first and said fourth transistor conductive only over one half cycle of operation; and means for rendering said second and said third transistor conductive only for the other half cycle of operation.

4. A semiconductor amplifier adapted to be connected to a power supply comprising in combination: a series resonant network having a predetermined resonant frequency to provide a low impedance to current flow at said resonant frequency but a relatively high impedance to current flow at harmonic frequencies; a first transistor coupling one end of said resonant circuit to a predetermined voltage of said power supply when conductive; a second transistor coupling said one end of said resonant circuit to a point reference potential when conductive; a third transistor coupling the opposite side of said resonant circuit to said predetermined voltage of said power supply when conductive; and a fourth transistor coupling said opposite end of said resonant circuit to said reference potential when conductive; driver means for selectively rendering said first, said second, said third and said fourth transistors alternately conductive and non-conductive over each cycle of operation such that said first and said fourth transistor are rendered conductive only during one half cycle of operation and said second and said third transistor are rendered conductive only during the other half cycle of operation, said driver means further having a frequency of operation substantially equal to said resonant frequency and providing a switching signal to said transistors for maintaining a minimum saturation resistance throughout the respective conductive half cycle of operation; and output means coupled to said resonant circuit for providing an output signal which is responsive to current flow in said resonant circuit during each half cycle of operation.

5. A power amplifier comprising, in combination; a resonant network having a low impedance to a fundamental frequency and a high impedance to harmonic frequencies thereof; means for connecting a load to said network; terminal means including first polarity and second polarity terminals for connection to a source of voltage; first transistor means connecting said resonant network to said first polarity terminal and operative in a switching mode for charging said network in one direction; second transistor means connecting said resonant network to said first polarity terminal and operative in a switching mode for charging said network in the opposite direction; and means for rendering said first and said second transistor means alternately conductive for each half cycle of the fundamental frequency current wave form to alternately charge said network in opposite directions.

References Cited by the Examiner

UNITED STATES PATENTS

| | | | |
|---|---|---|---|
| 2,910,689 | 10/1959 | Grace | 330—15 X |
| 2,926,307 | 2/1960 | Ehret | 330—18 |
| 3,115,582 | 12/1963 | Yoshii et al. | 330—18 X |

OTHER REFERENCES

German application 1,111,672, July 27, 1961.

ROY LAKE, *Primary Examiner.*

NATHAN KAUFMAN, *Examiner.*